(12) United States Patent
Maeng et al.

(10) Patent No.: US 8,884,269 B2
(45) Date of Patent: Nov. 11, 2014

(54) NITRIDE-BASED SEMICONDUCTOR LIGHT EMITTING DEVICE

(75) Inventors: Jong Sun Maeng, Gwangju (KR); Bum Joon Kim, Seoul (KR); Ki Sung Kim, Gyeonggi-do (KR); Suk Ho Yoon, Seoul (KR); Sung Tae Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 54 days.

(21) Appl. No.: 13/555,370

(22) Filed: Jul. 23, 2012

(65) Prior Publication Data

US 2013/0020555 A1 Jan. 24, 2013

(30) Foreign Application Priority Data

Jul. 22, 2011 (KR) ........................ 10-2011-0073160

(51) Int. Cl.
| | | |
|---|---|---|
| *H01L 29/06* | (2006.01) | |
| *H01L 31/00* | (2006.01) | |
| *H01L 33/32* | (2010.01) | |
| *H01L 33/12* | (2010.01) | |
| *H01L 33/02* | (2010.01) | |

(52) U.S. Cl.
CPC ................ *H01L 33/32* (2013.01); *H01L 33/12* (2013.01); *H01L 33/02* (2013.01)
USPC ........................ 257/13; 257/E33.008; 438/46

(58) Field of Classification Search
None
See application file for complete search history.

(56) References Cited

U.S. PATENT DOCUMENTS

| | | | | |
|---|---|---|---|---|
| 2004/0113141 A1* | 6/2004 | Isuda et al. | ...................... | 257/13 |
| 2005/0173725 A1* | 8/2005 | Kunisato et al. | ............... | 257/103 |
| 2006/0098703 A1* | 5/2006 | Kuramoto | .................. | 372/43.01 |
| 2006/0138449 A1* | 6/2006 | Hon et al. | ...................... | 257/103 |
| 2008/0237640 A1* | 10/2008 | Mishra et al. | .................. | 257/194 |

FOREIGN PATENT DOCUMENTS

| | | |
|---|---|---|
| JP | 10-125956 | 5/1998 |
| JP | 2008-277539 | 11/2008 |
| KR | 2001-0090499 A | 10/2001 |

OTHER PUBLICATIONS

Kim et al. "Stable temperature characteristics of InGaN blue light emitting diodes using AlGaN/GaN/InGaN superlattice as electron blocking layer," Applied Physics Letters 96, 091104 (2010).*

* cited by examiner

*Primary Examiner* — Minh-Loan Tran
*Assistant Examiner* — Shaka White
(74) *Attorney, Agent, or Firm* — Muir Patent Consulting, PLLC

(57) ABSTRACT

A nitride-based semiconductor light emitting device includes an anti-bowing layer having a composition of $Al_xGa_{1-x}N$ ($0.01 \leq x \leq 0.04$), and a light emitting structure formed on the anti-bowing layer and including a first conductivity-type nitride semiconductor layer, an active layer, and a second conductivity-type nitride semiconductor layer.

20 Claims, 7 Drawing Sheets

NITRIDE-BASED SEMICONDUCTOR LIGHT EMITTING DEVICE

CROSS-REFERENCE TO RELATED APPLICATIONS

This application claims the priority of Korean Patent Application No. 10-2011-0073160 filed on Jul. 22, 2011, in the Korean Intellectual Property Office, the disclosure of which is incorporated herein by reference.

BACKGROUND OF THE INVENTION

1. Field of the Invention

The present invention relates to a nitride-based semiconductor light emitting device.

2. Description of the Related Art

In general, a nitride semiconductor has been widely used in a green or blue light emitting diode (LED) or a in a laser diode (LD) provided as a light source in a full-color display, an image scanner, various signaling systems, or in an optical communications device. The nitride semiconductor light emitting device may be provided as a light emitting device having an active layer emitting light of various colors, including blue and green, through the recombination of electrons and holes.

As remarkable progress has been made in the area of nitride semiconductor light emitting devices since they were first developed, the utilization thereof has been greatly expanded and research into utilizing semiconductor light emitting devices for the purpose of general illumination devices, as well as for light sources in electronic devices, has been actively undertaken. In particular, related art nitride light emitting devices have largely been used as components in low-current/low output mobile products, and recently, the utilization of nitride light emitting devices has extended into the field of high current/high output devices. Thus, research into improving the luminous efficiency and quality of semiconductor light emitting devices is actively ongoing.

SUMMARY OF THE INVENTION

An aspect of the present invention provides a nitride-based semiconductor light emitting device having a reduced bowing phenomenon and excellent crystallinity.

Another aspect of the present invention provides a nitride-based semiconductor light emitting device having enhanced optical power (or light output).

According to an aspect of the present invention, there is provided a nitride-based semiconductor light emitting device including: an anti-bowing layer having a composition of $Al_xGa_{1-x}N$ ($0.01 \leq x \leq 0.04$); and a light emitting structure formed on the anti-bowing layer and including a first conductivity-type nitride semiconductor layer, an active layer, and a second conductivity-type nitride semiconductor layer.

The anti-bowing layer may have a thickness of 0.2 to 4 times that of the first conductivity-type nitride semiconductor layer.

The anti-bowing layer may have a thickness ranging from 0.5 μm to 4 μm.

The first conductivity-type nitride semiconductor layer may have a composition of $Al_yGa_{1-y}N$ ($0.01 \leq x \leq 0.04$, $0 \leq y < x$).

The first conductivity-type nitride semiconductor layer may be doped with silicon (Si) to have a concentration of $3 \times 10^{18}/cm^3$ to $2 \times 10^{19}/cm^3$.

The anti-bowing layer may be doped to have a first conductivity-type.

The anti-bowing layer may be doped to have the same doping concentration as that of the first conductivity-type nitride semiconductor layer.

The anti-bowing layer may be doped with silicon (Si) to have a concentration of $1 \times 10^{17}/cm^3$ or higher.

The anti-bowing layer and the first conductivity-type nitride semiconductor layer may have the same composition.

The nitride-based semiconductor light emitting device may further include a substrate for growth of semiconductor, wherein the anti-bowing layer, the first conductivity-type nitride semiconductor layer, the active layer, and the second conductivity-type nitride semiconductor layer may be sequentially formed on the semiconductor growth layer.

The nitride-based semiconductor light emitting device may further include an undoped GaN layer formed between the substrate for growth of semiconductor and the anti-bowing layer.

The nitride-based semiconductor light emitting device may further include a nucleation layer made of $Al_zGa_wIn_{1-z-w}N$ ($0 \leq z \leq 1$, $0 \leq w \leq 1$) formed between the substrate for growth of semiconductor and the anti-bowing layer.

The nitride-based semiconductor light emitting device may further include an electron blocking layer formed on the active layer and having a superlattice structure in which AlGaN, GaN, and InGaN are alternately laminated.

The AlGaN layer of the superlattice structure may have a thickness reduced as the AlGaN layer is closer to the second conductivity-type nitride semiconductor layer, and the GaN layer and the InGaN layer of the superlattice structure may have a thickness increased as the GaN layer and the InGaN layer are closer to the second conductivity-type nitride semiconductor layer.

The nitride-based semiconductor light emitting device may further include a conductive substrate formed on the second conductivity-type nitride semiconductor layer.

The nitride-based semiconductor light emitting device may further include first and second electrodes electrically connected to the first and second conductivity-type nitride semiconductor layers, respectively.

The first and second conductivity-type nitride semiconductor layers may be doped with an n-type impurity and a p-type impurity, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
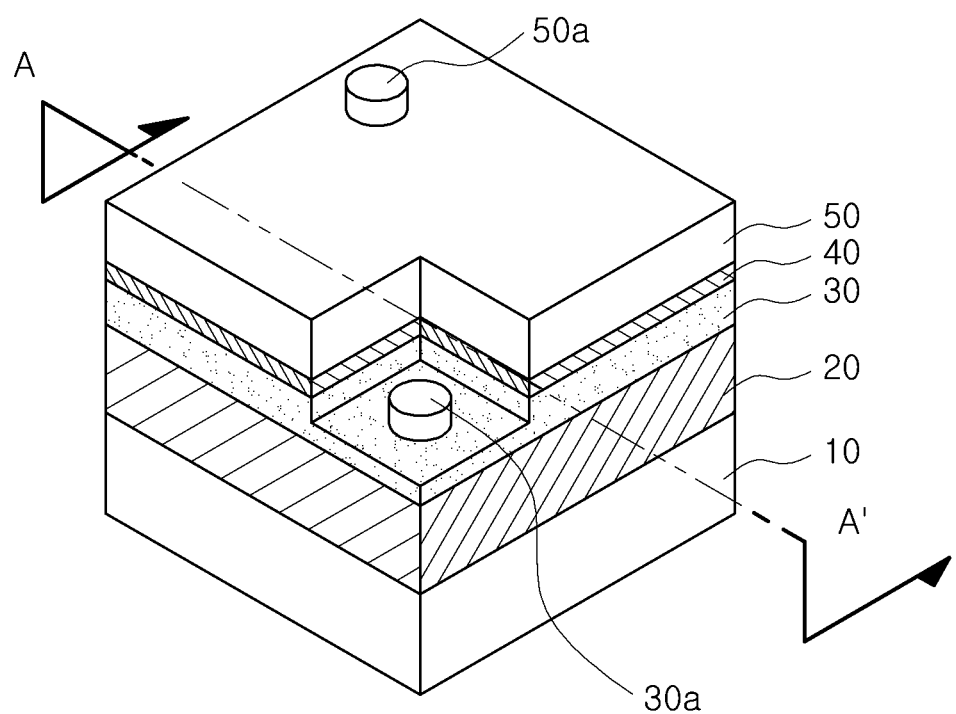
FIG. 1 is a perspective view of a nitride-based semiconductor light emitting device according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a perspective view of a nitride-based semiconductor light emitting device according to an embodiment of the present invention. With reference to FIG. 1, a nitride-based semiconductor light emitting device 100 includes an anti-bowing layer 20 having a composition of $Al_xGa_{1-x}N$ ($0.01 \le x \le 0.04$) and a light emitting structure formed on the anti-bowing layer 20 and having a first conductivity-type nitride semiconductor layer 30, an active layer 40, and a second conductivity-type nitride semiconductor layer 50. Here, as illustrated in FIG. 1, the anti-bowing layer 20, the first conductivity-type nitride semiconductor layer 30, the active layer 40, and the second conductivity-type nitride semiconductor layer 50 may be sequentially laminated on the substrate 10, and the nitride-based semiconductor light emitting device 100 may further include first and second electrodes 30a and 50a.

As the substrate 10, a substrate made of a material such as sapphire, SiC, $MgAl_2O_4$, MgO, $LiAlO_2$, $LiGaO_2$, GaN, or the like, may be used. In this case, sapphire is a crystal having Hexa-Rhombo R3c symmetry, of which lattice constants in c-axis and a-axis directions are 13.001 Å and 4.758 Å, respectively. The sapphire crystal has a C plane (0001), an A plane (1120), an R plane (1102), and the like. In this case, a nitride thin film may be relatively easily formed on the C plane of the sapphire crystal and because sapphire crystal is stable at high temperatures, sapphire crystal is commonly used as a material for a nitride growth substrate. A buffer layer (not shown) may be employed as an undoped semiconductor layer made of a nitride, or the like, to alleviate a lattice defect in the semiconductor layer grown thereon.

In the present embodiment, the first and second conductivity-type semiconductor layers 30 and 50 may be n-type and p-type semiconductor layers, respectively, and may be made of a nitride semiconductor. Thus, in the present embodiment, the first and second conductivity-types may be understood to indicate n-type and p-type conductivities, respectively, but the present invention is not limited thereto. The first and second conductivity-type semiconductor layers 30 and 50 may be made of a material expressed by an empirical formula $Al_xIn_yGa_{(1-x-y)}N$ (here, $0 \le x \le 1$, $0 \le y \le 1$, $0 \le x+y \le 1$), and such a material may include GaN, AlGaN, InGaN, and the like. The active layer 40 disposed between the first and second conductivity-type semiconductor layers 30 and 50 emits light having a certain level of energy according to electron and hole recombination, and may have a multi-quantum well (MQW) structure in which a quantum well and a quantum barrier are alternately laminated. Here, the MQW structure may be, for example, an InGaN/GaN structure. Meanwhile, the first and second conductivity-type semiconductor layers 30 and 50 and the active layer 40 may be formed by using a semiconductor layer growth process such as such as metal organic chemical vapor deposition (MOCVD), hydride vapor phase epitaxy (HVPE), molecular beam epitaxy (MBE), or the like, known in the art.

First and second electrodes 30a and 50a may be formed on the first and second conductivity-type nitride semiconductor layers 30 and 50 and electrically connected to the second conductivity-type nitride semiconductor layers 30 and 50. As illustrated in FIG. 1, the first electrode 30a may be formed on the first conductivity-type nitride semiconductor layer 30 exposed as portions of the second conductivity-type nitride semiconductor layer 50, the active layer 40, and the first conductivity-type nitride semiconductor layer 30 are etched, and the second electrode 50a may be formed on the second conductivity-type nitride semiconductor layer 50. In this case, a transparent electrode made of ITO, ZnO, or the like, may further be provided between the second conductivity-type nitride semiconductor layer 50 and the second electrode 50a in order to enhance an ohmic-contact function between the second conductivity-type nitride semiconductor layer 50 and the second electrode 50a.

In the case of the structure illustrated in FIG. 1, the first and second conductivity-type electrodes 30a and 50a may be formed to face in the same direction, but the position and connection structure of the first and second conductivity-type electrodes 30a and 50a may be variably modified as necessary. Also, in the present embodiment, it is illustrated that the first electrode 30a is formed on an exposed region of the first conductivity-type nitride semiconductor layer 30, but, alternatively, the first electrode 30a may be formed on a portion of the anti-bowing layer 20 exposed by removing portions of the second conductivity-type nitride semiconductor layer 50, the active layer 40, the first conductivity-type nitride semiconductor layer 39, and the anti-bowing layer 20.

The anti-bowing layer 20 formed on the substrate 10 may have a composition of $Al_xGa_{1-x}N$ ($0.01 \le x \le 0.04$). The anti-bowing layer 20 may restrain a generation of bowing due to a difference between lattice constants of the substrate 10 and the nitride-based semiconductor layer and secure crystallinity of the semiconductor layer formed thereon. In detail, a heterogeneous substrate such as sapphire used for growing a GaN thin film thereon has a high lattice mismatch and high thermal expansion coefficient with GaN, generating a lattice defect due to a difference in the lattice constants and thermal expansion coefficients, and the substrate may thereby be bowed (i.e., bent or curved) due to the difference in the thermal expansion coefficients in a semiconductor growth process performed at a high temperature. The lattice defect generated in the GaN layer grown on the heterogeneous substrate significantly affects reliability of the semiconductor light emitting device and causes a difficulty in performing a follow-up process due to the bowed substrate.

However, according to the present embodiment, in order to lessen stress due to the difference between the lattice constants of GaN and the substrate, an AlGaN layer is disposed therebetween, thus preventing the substrate from bowing, restraining a generation of defects in the semiconductor layer laminated thereon, and limiting the proportion of aluminum (Al) of AlGaN to 0.01 to 0.04 to thus solve the degradation of crystallinity according to free reaction when the AlGaN layer is grown. Here, in order to sufficiently obtain the anti-bowing effect in the anti-bowing layer 20 having the composition of AlGaN, the thickness of the anti-bowing layer 20 may be 0.2 to 4 times that of the first conductivity-type nitride semiconductor layer 30, and as a result, the nitride-based semiconductor light emitting device having crystallinity and reduced bowing generation can be obtained. Also, AlGaN has an energy band greater than that of GaN, reducing light absorption in the UV region in the nitride-based semiconductor light emitting device 100, enhancing luminance.

In the present embodiment, the first conductivity-type nitride semiconductor layer 30 formed on the anti-bowing layer 20 may be made of $Al_yGa_{1-y}N$ (0≤y<x) containing a smaller amount of aluminum (Al) than that of the anti-bowing layer 20, and in this case, a nitride-based semiconductor light emitting device having excellent crystallinity can be fabricated.

The anti-bowing layer 20 may have a thickness of 0.2 to 4 times that of the first conductivity-type nitride semiconductor layer 30. For example, the anti-bowing layer 20 may have a thickness ranging from 0.5 µm to 4 µm, preferably, a thickness ranging from 1 µm to 3 µm. In the present embodiment, the anti-bowing layer 20 may be undoped or doped to have a first conductivity-type, and since it has a high level of crystallinity due to a low composition rate of aluminum (Al), when the anti-bowing layer 20 is doped to have a first conductivity-type, the anti-bowing layer 20 may serve a first conductivity-type nitride semiconductor layer by itself. Namely, if the anti-bowing layer 20 having poor crystallinity is heavily doped with silicon (Si) in an amount of $1×10^{17}/cm^3$ or more, leakage current characteristics of the device would be degraded, but in the present embodiment, since the composition rate of aluminum (Al) is lowered to have high level of crystallinity, the anti-bowing layer 20 may be heavily doped with silicon (Si) in the amount of $1×10^{17}/cm^3$ or more to thereby maximize an electron flow in a horizontal direction without degrading leakage current characteristics.

Figure 2:
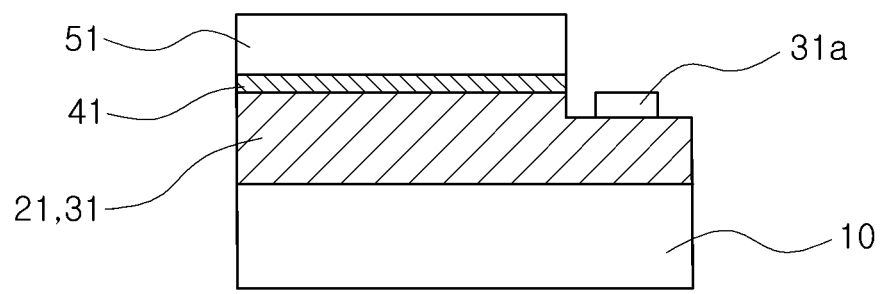
FIG. 2 is a cutaway cross-sectional view schematically showing a nitride-based semiconductor light emitting device according to another embodiment of the present invention.

FIG. 2 is a cutaway cross-sectional view schematically showing a nitride-based semiconductor light emitting device according to another embodiment of the present invention. A perspective view of a nitride-based semiconductor light emitting device 101 according to the present embodiment may be similar to that of FIG. 1, and FIG. 2 is a view showing a section taken along line A-A' in FIG. 1. Unlike the embodiment illustrated in FIG. 1, in the nitride-based semiconductor light emitting device 101, an anti-bowing layer 21 and a first conductivity-type nitride semiconductor layer 31 are formed to have the same composition and doping concentration. In detail, the first conductivity-type nitride semiconductor layer 31 has a composition of $Al_xGa_{1-x}N$ (0.01≤x≤0.04) and the anti-bowing layer 21 is doped to be the first conductivity-type. As described above, the anti-bowing layer 21 itself may serve as the first conductivity-type nitride semiconductor layer 31. Thus, by forming the anti-bowing layer 21 and the first conductivity-type nitride semiconductor layer 31 such that they have the same composition and same impurity, a fabrication process and structure can be simplified.

Figure 3:
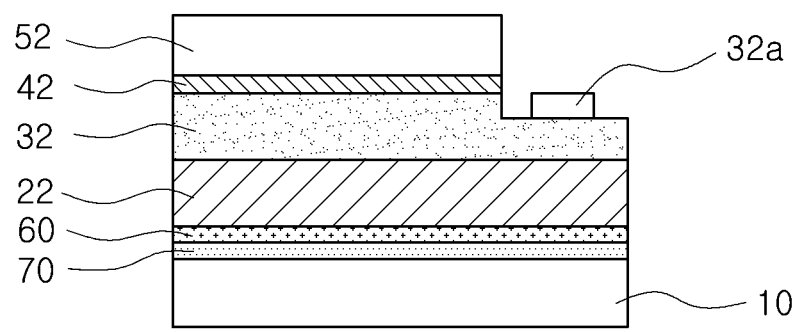
FIG. 3 is a cutaway cross-sectional view schematically showing a nitride-based semiconductor light emitting device according to another embodiment of the present invention.

FIG. 3 is a cutaway cross-sectional view schematically showing a nitride-based semiconductor light emitting device according to another embodiment of the present invention. A nitride-based semiconductor light emitting device 102 according to the present embodiment includes a substrate 10, an anti-bowing layer 22 formed on the substrate 10 and having a composition of $Al_xGa_{1-x}N$ (0.01≤x≤0.04), a first conductivity-type nitride semiconductor layer 32 formed on the anti-bowing layer 22, an active layer 42 formed on the first conductivity-type nitride semiconductor layer 32, a second conductivity-type nitride semiconductor layer 52 formed on the active layer 42, and an undoped GaN layer 60 and a nucleation layer 70 formed between the substrate 10 and the anti-bowing layer 22.

The undoped GaN layer 60 and the nucleation layer 70 are buffer layers serving to minimize a generation of a defect such as a dislocation and restrain propagation of the defect, and may be interposed between the substrate 10 and a semiconductor layer. The nucleation layer 70 may be made of $Al_zGa_wIn_{1-z-w}N$ (0≤z≤1, 0≤w≤1) and formed to have a thickness ranging from about 20 nm to 30 nm at a low temperature of about 500° C. Also, in the present embodiment, it is illustrated that the undoped GaN layer 60 and the nucleation layer 70 are sequentially formed between the substrate 10 and the anti-bowing layer 20, but, alternatively, only one of the undoped GaN layer 60 and the nucleation layer 70 may be interposed between the substrate 10 and the anti-bowing layer 20, or the nucleation layer 70 may be formed on the undoped GaN layer 60.

Figure 4:
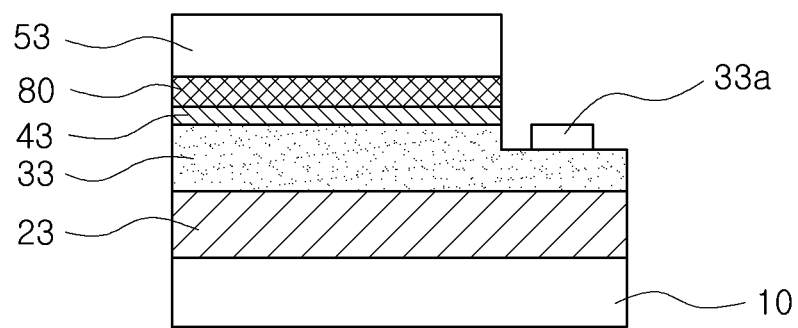
FIG. 4 is a cutaway cross-sectional view schematically showing a nitride-based semiconductor light emitting device according to another embodiment of the present invention.

FIG. 4 is a cutaway cross-sectional view schematically showing a nitride-based semiconductor light emitting device according to another embodiment of the present invention. A nitride-based semiconductor light emitting device 103 according to the present embodiment includes a substrate 10, an anti-bowing layer 23 formed on the substrate 10 and having a composition of $Al_xGa_{1-x}N$ (0.01≤x≤0.04), a first conductivity-type nitride semiconductor layer 33 formed on the anti-bowing layer 23, an active layer 43 formed on the first conductivity-type nitride semiconductor layer 33, a second conductivity-type nitride semiconductor layer 53 formed on the active layer 43, and an electron blocking layer 80 formed on the active layer 43.

Unlike the embodiment illustrated in FIG. 1, the nitride-based semiconductor light emitting device 103 according to the present embodiment further includes the electron blocking layer, and the electron blocking layer 80 may block electrons which have passed through the active layer 43. In the present embodiment, when the first and second conductivity-type nitride semiconductor layers 33 and 53 are n-type and p-type semiconductor layers, respectively, the active layer 43 emits light according to the recombination of electrons generated in the n-type semiconductor layer 33 and holes generated in the p-type semiconductor layer 53. Thus, as the efficiency of electron-hole recombination in the active layer 43 is promoted, luminance efficiency is increased. In the present embodiment, since the electron blocking layer 80 is disposed on the active layer 43 to block a flow of electrons passing through the active layer 43 from the n-type semiconductor layer 33, electron-hole recombination efficiency is increased in the active layer 43.

The electron blocking layer 80 may have a superlattice structure in which AlGaN, GaN, and InGaN are alternately laminated, and here, AlGaN, GaN, and InGaN constituting the electron blocking layer 80 may have different thicknesses. For example, the electron blocking layer 80 may have a structure in which AlGan/GaN/InGaN is repeated, and the AlGaN layer may have a thickness reduced toward the p-type semiconductor layer 53 from the p-type semiconductor layer 53, and the GaN layer and the InGaN layer may have a thickness increased as they are closer to the p-type semiconductor layer 53 from the active layer 43. In this case, AlGaN has great band gap energy, so it prevents electrons injected from the n-type semiconductor layer 33 to the active layer 43 from overpassing the p-type semiconductor layer 53, and since the thickness of the AlGaN layer is reduced toward the p-type semiconductor layer 53, the AlGaN layer does not degrade efficiency of injecting holes into the active layer. Also, the GaN and InGaN layer have band gap energy less than that of the AlGaN layer, having a possibility that electrons will overpass the p-type semiconductor layer 53 through the active layer 43, but here, since the thicknesses of the GaN layer and the InGaN layer are increased as the GaN layer and the InGaN layer are closer to the p-type semiconductor layer 53, the GaN layer and the InGaN layer can effectively block electrons from overpassing.

Figure 5:
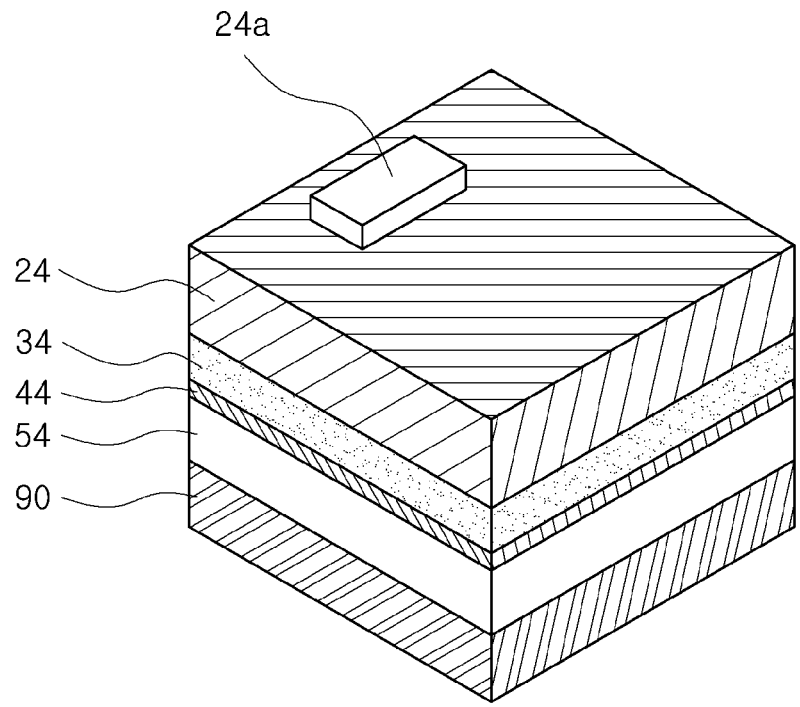
FIG. 5 is a perspective view of a nitride-based semiconductor light emitting device according to another embodiment of the present invention.

FIG. 5 is a perspective view of a nitride-based semiconductor light emitting device according to another embodiment of the present invention. With reference to FIG. 5, a semiconductor light emitting device 104 according to the present embodiment may include a second conductivity-type nitride semiconductor layer 54, an active layer 44, a first conductivity-type nitride semiconductor layer 34, and an anti-bowing layer 24 sequentially formed on a conductive substrate 90. Similar to that of the former embodiment, the anti-bowing layer 24 may have a composition of $Al_xGa_{1-x}N$ ($0.01 \leq x \leq 0.04$). However, unlike the embodiment illustrated in FIG. 1, the conductive substrate 90 may be formed on the second conductivity-type nitride semiconductor layer 54, and a substrate for growth of semiconductor disposed on the anti-bowing layer 24 may be eliminated.

The conductive substrate 90 may serve as a support supporting a light emitting structure including the first and second conductivity-type nitride semiconductor layers 34 and 54, the active layer 44, and the anti-bowing layer 24 in a process such as laser lift-off, or the like, for eliminating a substrate for growth of semiconductor (not shown) from the anti-bowing layer 24, the first conductivity-type nitride semiconductor layer 34, the active layer 44, and the second conductivity-type nitride semiconductor layer 54 sequentially formed on the substrate for growth of semiconductor (not shown). The conductive substrate 90 may be made of a material including any one of gold (Au), nickel (Ni), aluminum (Al), copper (Cu), tungsten (W), silicon (Si), selenium (Se), and gallium arsenide (GaAs). For example, the conductive substrate 90 may be made of a material doped with Al on a Si substrate. In the present embodiment, the conductive substrate 90 may be joined to the light emitting structure by the medium of a conductive adhesive layer (not shown). The conductive adhesive layer may be made of a eutectic metal material such as, for example, AuSn, or the like.

The conductive substrate 90 may serve as a second electrode applying an electrical signal to the second conductivity-type nitride semiconductor layer, and as shown in FIG. 5, when the electrode is formed in a vertical direction, a current flow region may be enlarged to improve a current dispersion function. Meanwhile, a first electrode 24a may be formed on the anti-bowing layer 24 and electrically connected to the first conductivity-type nitride semiconductor layer 34, and although not shown, portions of the anti-bowing layer 24 and the first conductivity-type nitride semiconductor layer 34 may be etched and the first electrode may be formed on the exposed portion of the first conductivity-type nitride semiconductor layer 34.

Figure 6:
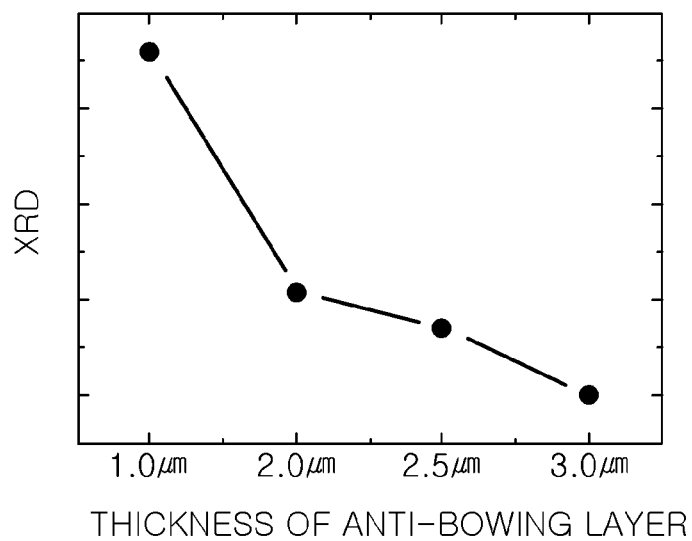
FIG. 6 is a graph of a full width at half maximum (FWHM) of X-ray diffraction (XRD) on a (002) plane of the anti-bowing layer according to an embodiment of the present invention.

FIG. 6 is a graph of a full width at half maximum (FWHM) of X-ray diffraction (XRD) on a (002) plane of the anti-bowing layer according to an embodiment of the present invention. With reference to FIG. 6, it can be seen that, as the thickness of the anti-bowing layer having a composition of $Al_xGa_{1-x}N$ ($0.01 \leq x \leq 0.04$) is increased, a full with at half maximum (FWHM) (unit: arcsec) of XRD is reduced. The XRD analysis is a method used for interpreting a crystal structure of a thin film material having crystallinity, a catalyst material having a power form, or the like, and as the FWHM is smaller, high crystallinity is obtained. As shown in FIG. 6, the results obtained by measuring a FWHM of the GaN layer formed on the anti-bowing layer according to an embodiment of the present invention by using XRD reveals that the FWHM is reduced as the thickness of the GaN layer is increased, and thus, the interposing of the anti-bowing layer having a relatively large thickness can obtain an effect of enhancing crystallinity of the semiconductor layer.

Figure 7:
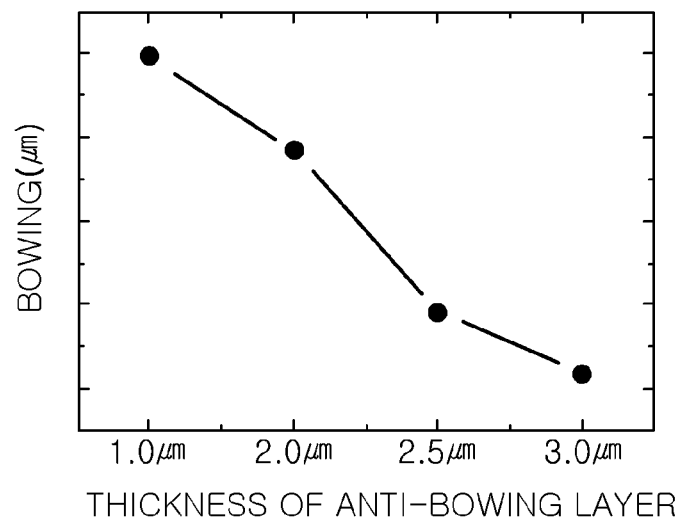
FIG. 7 is a graph of bowing a generation degree over a thickness of the anti-bowing layer according to an embodiment of the present invention.

FIG. 7 is a graph of a bowing generation degree over a thickness of the anti-bowing layer according to an embodiment of the present invention. In the graph of FIG. 7, the horizontal axis indicates the thickness of the anti-bowing layer and the vertical axis indicates a degree of bowing of the semiconductor light emitting device. When a nitride-based semiconductor layer is grown on a substrate for growth of semiconductor, a bowing phenomenon in which the substrate is bowed due to a difference between lattice constants and thermal expansion coefficients of the substrate and the GaN semiconductor layer occurs. Here, a degree of bowing of the substrate may be digitized by measuring the difference between heights of the highest portion and the lowest portion of the substrate, and the vertical axis in FIG. 7 indicates values measured in this manner. As shown in the graph of FIG. 7, it can be seen that, as the thickness of the anti-bowing layer is increased, the degree of bowing of the substrate is reduced.

Figure 8:
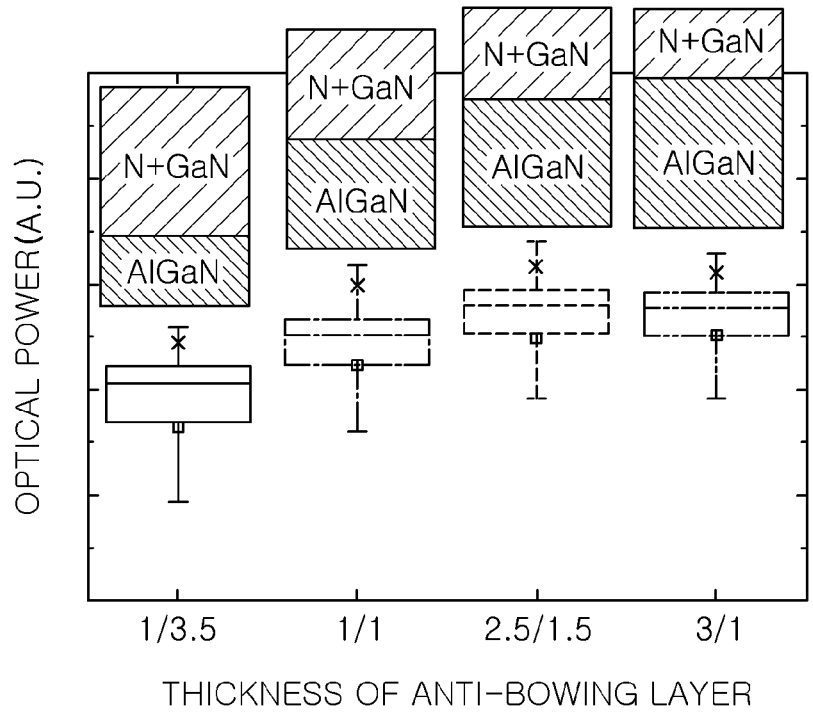
FIG. 8 is a graph of optical power (or light output) over the thickness of the anti-bowing layer of the nitride-based semiconductor light emitting device according to an embodiment of the present invention.

FIG. 8 is a graph of optical power over the thicknesses of the anti-bowing layer of the nitride-based semiconductor light emitting device according to an embodiment of the present invention. In the graph of FIG. 8, the horizontal axis represents a relative thickness of the anti-bowing layer to the first conductivity-type nitride semiconductor layer (anti-bowing layer/first conductivity-type nitride semiconductor layer), and the vertical axis represents optical power. In detail, as the first conductivity-type nitride semiconductor layer, GaN doped with n-type impurity is applied, and in a state in which a total thickness of the first conductivity-type nitride semiconductor layer and the anti-bowing layer is maintained to be 4.5 μm, optical power was measured while changing a relative thickness of each layer. With reference to FIG. 8, it can be seen that, in comparison to a case in which the thickness of the first conductivity-type nitride semiconductor layer is 3.5 μm and that of the anti-bowing layer is 1 μm (1/3.5), when the thickness of the first conductivity-type nitride semiconductor layer is equal to that of the anti-bowing layer (2/2) or when the thickness of the anti-bowing layer is greater than that of the first conductivity-type nitride semiconductor layer (2.5/2 or 3/1.5), optical power is significantly improved.

However, in the experimental results illustrated in FIGS. 6 through 8, the present invention is not limited to the case in which the anti-bowing layer is thicker than the first conductivity-type nitride semiconductor layer, and a relative thickness range of the anti-bowing layer may vary according to the thickness of the first conductivity-type nitride semiconductor layer. For example, the anti-bowing layer may have a thickness of 0.2 to 4 times that of the first conductivity-type nitride semiconductor layer.

Figure 9:
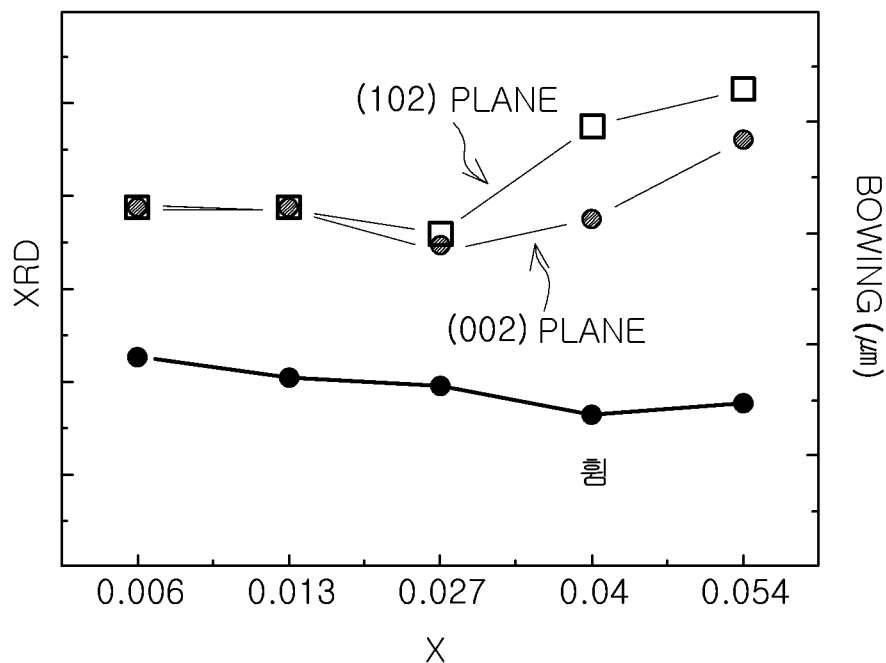
FIG. 9 is a graph of XRD measurement results and a degree of bowing over an Al composition range of the anti-bowing layer having a composition of $Al_xGa_{1-x}N$.

FIG. 9 is a graph of XRD measurement results and a degree of bowing over an Al composition range of the anti-bowing layer having a composition of $Al_xGa_{1-x}N$. In FIG. 9, the horizontal axis represents a relative proportion of x in the anti-bowing layer having the composition of $Al_xGa_{1-x}N$, and the vertical axis represents the FWHM and a degree of bowing of XRD. In detail, two graphs illustrated in an upper portion show a FWHM in a (102) plane and (002) plane of the GaN layer grown on an upper surface of the anti-bowing layer, respectively, and one graph illustrated in a lower portion represents a degree of bowing (a difference between the heights of the highest portion and the lowest portion, unit: μm) of the semiconductor light emitting device including the anti-bowing layer.

With reference to FIG. 9, as the composition rate (x) of aluminum (Al) of the anti-bowing layer having a composition of $Al_xGa_{1-x}N$ is increased from 0.06 to 0.027, the FWHM tends to be reduced, and thereafter, increased. Meanwhile, it can be seen that the degree of bowing of the substrate tends to be reduced during a section from 0.06 to 0.04 of the composition rate (x) of aluminum (A), and thereafter, increased. Thus, in the case of the nitride-based semiconductor light emitting device including the anti-bowing layer according to the present embodiment, it can be seen that, since the composition rate (x) of aluminum (Al) ranges from 0.01 to 0.04, both crystallinity and anti-bowing characteristics are satisfied.

Figure 10:
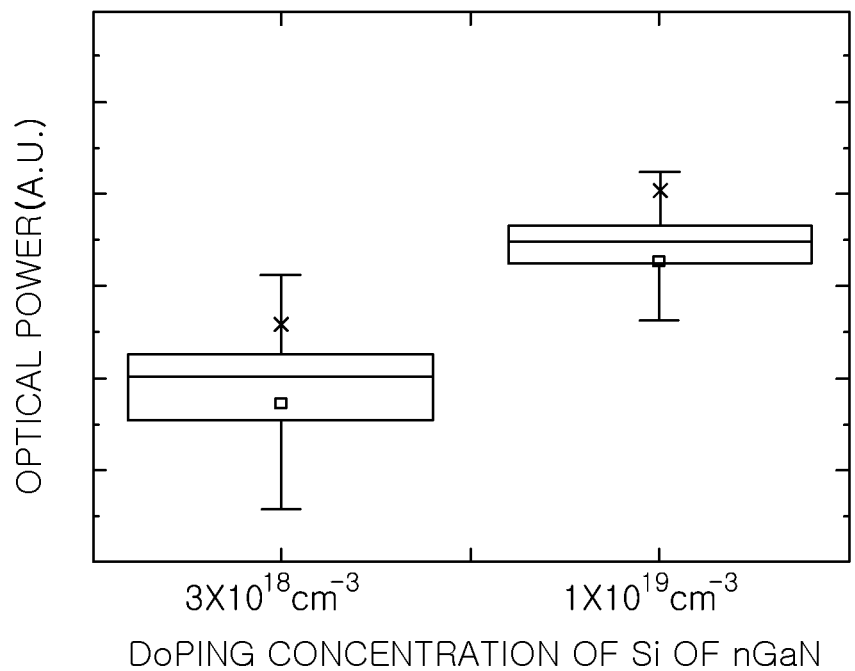
FIG. 10 is a graph of optical power over a doping concentration of a first conductivity-type nitride semiconductor layer formed on an upper surface of the anti-bowing layer according to an embodiment of the present invention.

FIG. 10 is a graph of optical power (or light output) over a doping concentration of the first conductivity-type nitride semiconductor layer formed on an upper surface of the anti-bowing layer according to an embodiment of the present invention. In detail, in the present embodiment, n-GaN was applied as the first conductivity-type nitride semiconductor layer and silicon (Si) was applied as an n-type impurity doped in the n-GaN layer. With reference to FIG. 10, it can be seen that when the first conductivity-type nitride semiconductor layer formed on the anti-bowing layer is heavily doped (in an amount of about $1 \times 10^{19}/cm^3$), optical power is significantly enhanced. Namely, since the n-GaN layer disposed on the anti-bowing layer is heavily doped, series resistance is reduced and current spreading is improved, thus enhancing optical power. Here, doping concentration of the first conductivity-type nitride semiconductor layer may range from an amount of about $3 \times 10^{18}/cm^3$ to $2 \times 10^{19}/cm^3$.

Figure 11A:
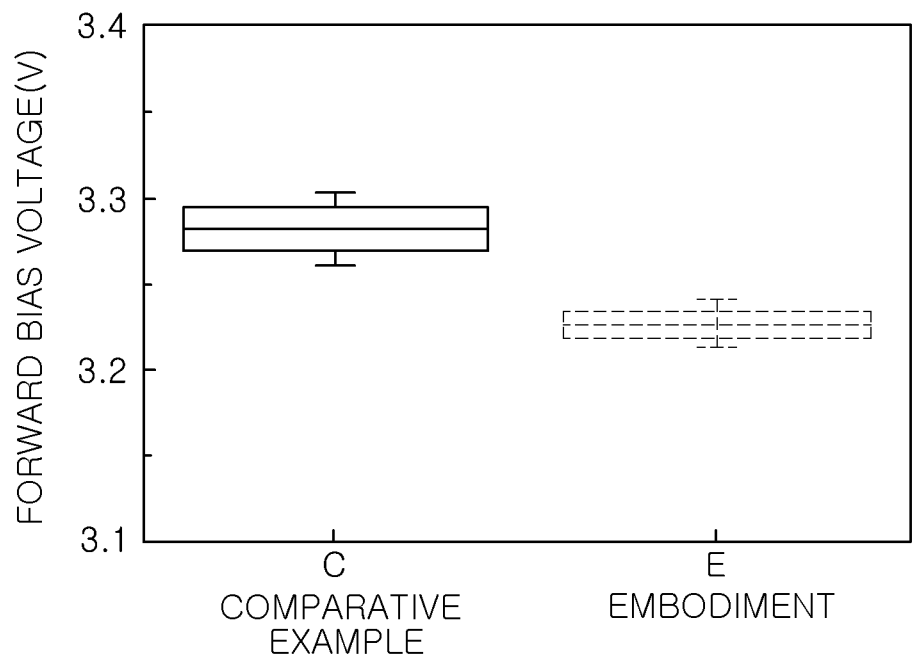
FIGS. 11A and 11B are graphs of a forward bias voltage and optical power of the nitride-based semiconductor light emitting device according to an embodiment of the present invention, respectively.
Figure 11B:
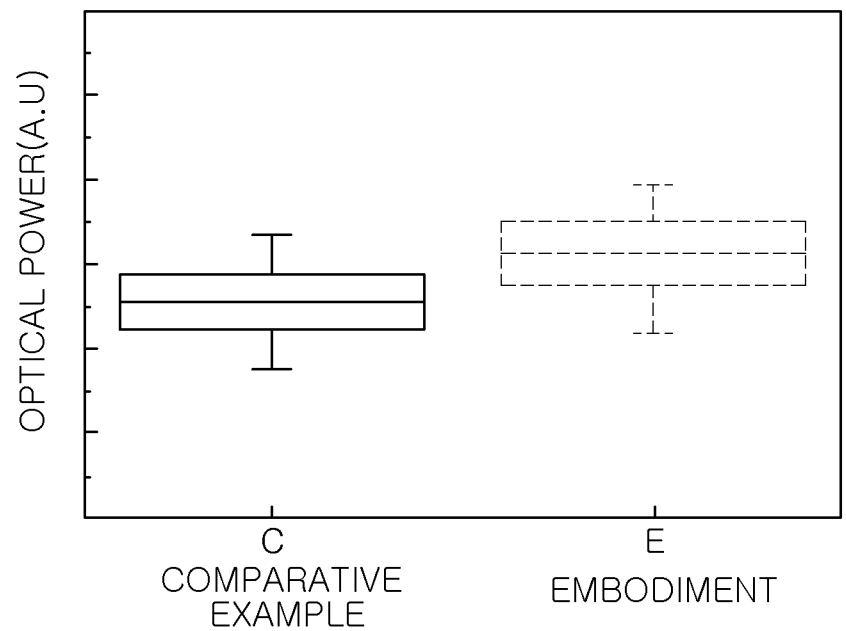

FIGS. 11A and 11B are graphs of a forward bias voltage and optical power of the nitride-based semiconductor light emitting device according to an embodiment of the present invention, respectively. In detail, FIG. 11A is a graph showing a comparison between forward bias voltages of nitride-based semiconductor light emitting devices according to the Comparative Example and Embodiment, and FIG. 11B is a graph showing a comparison between optical powers of nitride-based semiconductor light emitting devices according to the Comparative Example and Embodiment. The Comparative Example has a structure in which in which an anti-bowing layer is not interposed between a first conductivity-type nitride semiconductor layer (n-GaN) and an active layer, and the Embodiment has a structure in which an AlGaN layer is doped with silicon (Si) to have a concentration of $1 \times 10^{17}/cm^3$ or more is inserted between the first conductivity-type nitride semiconductor layer (n-GaN) and the active layer.

With reference to FIGS. 11A and 11B, in the case of the nitride-based semiconductor light emitting device according to the Embodiment of the present invention, current spreading in a horizontal direction is improved to thereby lower series resistance, thus obtaining an effect of reducing a forward bias voltage of the device and increasing optical power of the device.

Figure 12:
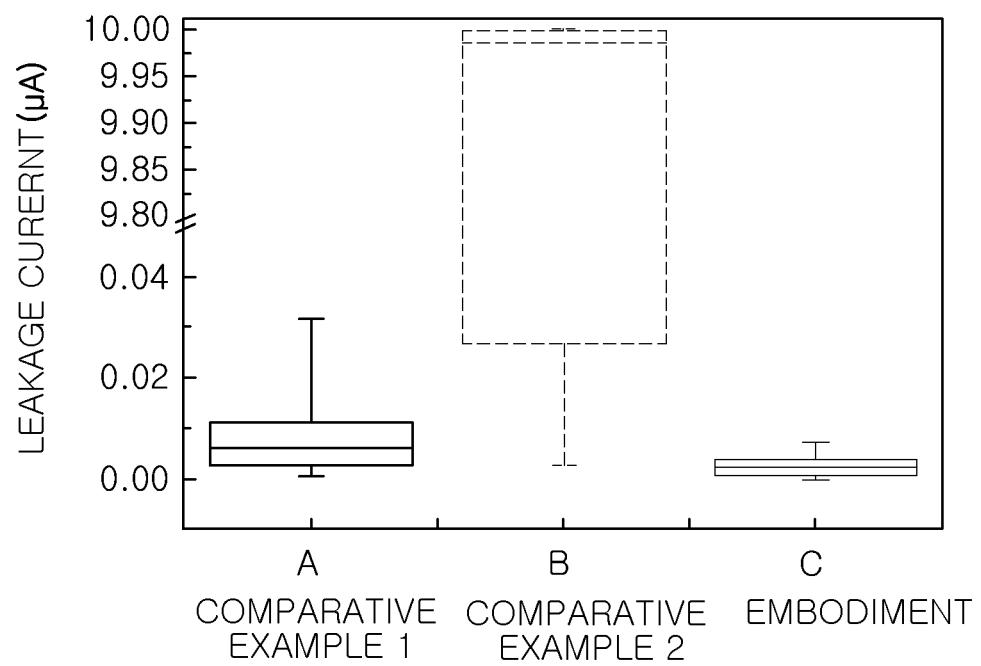
FIG. 12 is a graph showing a comparison between leakage currents of an embodiment of the present invention and Comparative Examples 1 and 2.

FIG. 12 is a graph showing a comparison between leakage currents of an embodiment of the present invention and Comparative Examples 1 and 2. The Comparative Example 1 has a structure in which an anti-bowing layer is not interposed between a first conductivity-type nitride semiconductor layer and an active layer like the Comparative Example of FIG. 11, and the Comparative Example 2 has a structure in which an $Al_xGa_{1-x}N$ layer is doped with silicon (Si) to have a concentration of $1 \times 10^{17}/cm^3$ or more is inserted between the first conductivity-type nitride semiconductor layer (n-GaN) and the active layer, but a composition rate of aluminum (Al) of the $Al_xGa_{1-x}N$ layer exceeds 0.04 (x>0.4), resulting in that (002)XRD FWHM has a value greater than 300 arcsec. Meanwhile, the Embodiment has a structure in which the $Al_xGa_{1-x}N$ layer ($0.01 \le x \le 0.04$) doped with silicon (Si) to have a concentration of $1 \times 10^{17}/cm^3$ or more is inserted between the first conductivity-type semiconductor layer (n-GaN) and the active layer, and (002)XRD FWHM has a value smaller than 300 arcsec.

With reference to FIG. 12, when the aluminum (Al) composition exceeds 0.04, crystallinity is degraded to increase a leakage current as a silicon (Si) doping concentration is increased (the Comparative Example 2). However, when the aluminum (Al) composition range is maintained to be 0.01 to 0.04 and a silicon (Si) doping concentration is increased as in the Embodiment, optical power can be enhanced without degrading leakage current characteristics.

As set forth above, according to embodiments of the invention, an occurrence of bowing of the substrate on which semiconductor layers are laminated is restrained to facilitate performing of a follow-up process, a generation and propagation of a dislocation defect is reduced and excellent crystallinity can be obtained. Thus, a nitride-based semiconductor light emitting device having a reduced bowing phenomenon and excellent crystallinity can be provided.

In addition, a nitride-based semiconductor light emitting device having enhanced optical power can be provided.

While the present invention has been shown and described in connection with the embodiments, it will be apparent to those skilled in the art that modifications and variations can be made without departing from the spirit and scope of the invention as defined by the appended claims.

What is claimed is:

1. A nitride-based semiconductor light emitting device comprising:
    a heterogeneous substrate for growth of a semiconductor;
    an anti-bowing layer having a composition of $Al_xGa_{1-x}N$ ($0.01 \le x \le 0.04$);
    a light emitting structure formed on the anti-bowing layer and including a first conductivity-type nitride semiconductor layer, an active layer, and a second conductivity-type nitride semiconductor layer, and
    a first electrode disposed on the first conductivity-type nitride semiconductor layer;
    wherein the first conductivity-type nitride semiconductor layer has a composition of $Al_yGa_{1-y}N$ ($0.01 \le x \le 0.04$, $0 \le y \le x$),
    wherein the anti-bowing layer, the first conductivity-type nitride semiconductor layer, the active layer, and the second conductivity-type nitride semiconductor layer are sequentially formed on the heterogeneous substrate for growth of a semiconductor.

2. The nitride-based semiconductor light emitting device of claim 1, wherein the anti-bowing layer has a thickness of 0.2 to 4 times that of the first conductivity-type nitride semiconductor layer.

3. The nitride-based semiconductor light emitting device of claim 1, wherein the anti-bowing layer has a thickness ranging from 0.5 μm to 4 μm.

4. The nitride-based semiconductor light emitting device of claim 1, wherein the first conductivity-type nitride semiconductor layer is doped with silicon (Si) to have a concentration of $3\times10^{18}/cm^3$ to $2\times10^{19}/cm^3$.

5. The nitride-based semiconductor light emitting device of claim 1, wherein the anti-bowing layer is doped to have a first conductivity-type.

6. The nitride-based semiconductor light emitting device of claim 5, wherein the anti-bowing layer is doped to have the same doping concentration as that of the first conductivity-type nitride semiconductor layer.

7. The nitride-based semiconductor light emitting device of claim 1, wherein the anti-bowing layer is doped with silicon (Si) to have a concentration of $1\times10^{17}/cm^3$ or more.

8. The nitride-based semiconductor light emitting device of claim 1, wherein the anti-bowing layer and the first conductivity-type nitride semiconductor layer have the same composition.

9. The nitride-based semiconductor light emitting device of claim 1, further comprising an undoped GaN layer formed between the heterogeneous substrate for growth of semiconductor and the anti-bowing layer.

10. The nitride-based semiconductor light emitting device of claim 1, further comprising a nucleation layer made of $Al_zGa_wIn_{1-z-w}N$ ($0 \le z \le 1$, $0 \le w \le 1$) formed between the heterogeneous substrate for growth of semiconductor and the anti-bowing layer.

11. The nitride-based semiconductor light emitting device of claim 1, further comprising an electron blocking layer formed on the active layer and having a superlattice structure in which AlGaN, GaN, and InGaN are alternately laminated.

12. The nitride-based semiconductor light emitting device of claim 11, wherein the AlGaN layer of the superlattice structure has a thickness reduced as the AlGaN layer is closer to the second conductivity-type nitride semiconductor layer, and the GaN layer and the InGaN layer of the superlattice structure have a thickness increased as the GaN layer and the InGaN layer are closer to the second conductivity-type nitride semiconductor layer.

13. The nitride-based semiconductor light emitting device of claim 1, further comprising a second electrode electrically connected to the second conductivity-type nitride semiconductor layer.

14. The nitride-based semiconductor light emitting device of claim 1, wherein the first and second conductivity-type nitride semiconductor layers are doped with an n-type impurity and a p-type impurity, respectively.

15. The nitride-based semiconductor light emitting device of claim 1, wherein the heterogeneous substrate is formed of sapphire.

16. The nitride-based semiconductor light emitting device of claim 1, wherein the heterogeneous substrate is formed of SiC.

17. The nitride-based semiconductor light emitting device of claim 1, wherein the heterogeneous substrate is formed of $MgAl_2O_4$.

18. The nitride-based semiconductor light emitting device of claim 1, wherein the heterogeneous substrate is formed of MgO.

19. The nitride-based semiconductor light emitting device of claim 1, wherein the heterogeneous substrate is formed of $LiAlO_2$.

20. The nitride-based semiconductor light emitting device of claim 1, wherein the heterogeneous substrate is formed of $LiGaO_2$.

* * * * *